United States Patent
Wang et al.

(10) Patent No.: US 10,778,204 B1
(45) Date of Patent: Sep. 15, 2020

(54) COMPARATOR CIRCUIT WITH LOW POWER CONSUMPTION AND LOW KICKBACK NOISE

(71) Applicant: NATIONAL CHIAO TUNG UNIVERSITY, Hsinchu (TW)

(72) Inventors: Shih-Hsing Wang, Hsinchu (TW); Chung-Chih Hung, Tainan County (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 16/778,682

(22) Filed: Jan. 31, 2020

(30) Foreign Application Priority Data

Dec. 5, 2019 (TW) .............................. 108144553 A (51) Int. Cl.
H03K 5/22 (2006.01)
H03K 5/24 (2006.01)
H03K 5/00 (2006.01)

(52) U.S. Cl.
CPC ..... *H03K 5/249* (2013.01); *H03K 2005/0013* (2013.01)

(58) Field of Classification Search
CPC ...... H03K 5/24; H03K 5/2472; H03K 5/2481; H03K 5/249; G01R 19/0038; H04L 5/0272; G11C 7/062; G11C 7/065; G11C 7/06; G11C 2207/063
See application file for complete search history.

(56) References Cited

U.S. PATENT DOCUMENTS

| 8,188,768 B2 | 5/2012 | Bae et al. |
| 2019/0229716 A1 | 7/2019 | Zillman et al. |
| 2019/0245499 A1* | 8/2019 | Kotamraju .......... H03F 3/45183 |

OTHER PUBLICATIONS

P.M. Figueiredo, et al., "Kickback Noise Reduction Techniques for CMOS Latched Comparators", IEEE Transactions on Circuits and Systems II: Express Briefs, vol. 53, No. 7, pp. 541-545, 2006.
S. Brenna, et al., "A 70.7-dB SNDR 100-kS/s 14-b SAR ADC with Attenuation Capacitance Calibration in 0.35 um CMOS", Analog Integrated Circuits and Signal Processing, vol. 89, pp. 357-371, 2016.
I.T. Abougindia, et al., "A Fast Two-Step Coarse-Fine Calibration (CFC) Technique for Precision Comparator Design", Proceedings of the IEEE International Conference on Electronics, Circuits and Systems, pp. 153-156, 2013.

(Continued)

*Primary Examiner* — Long Nguyen
(74) *Attorney, Agent, or Firm* — Rosenberg, Klein & Lee (57) ABSTRACT

A comparator circuit with low power consumption and low kickback noise includes a first dynamic comparator and a second dynamic comparator. The first dynamic comparator is a pre-amplifier for the second dynamic comparator. An enable switch which is connected to the first dynamic comparator has a control terminal connected to a resistance device. The resistance device and the enable switch form a RC delay circuit to reduce the kickback noise of the comparator circuit. Since the comparator circuit is composed of dynamic comparators, the power consumption of the comparator circuit is lower.

14 Claims, 6 Drawing Sheets

(56) References Cited

OTHER PUBLICATIONS

S, Brenna, et al., "Analysis and Optimization of a SAR ADC with Attenuation Capacitor", 2014 37th International Convention on Information and Communication Technology, Electronics and Microelectronics, MIPRO 2014—Proceedings, vol. 2, pp. 68-73, 2014.

D. Schinkel, et al., "ISSCC 2007/Session 17/Analog Techniques and PLLs/17.7 A Double-Tail Latch-Type Voltage Sense Amplifier with 18ps Setup + Hold Time", Solid-State Circuits Conference, 2007, ISSCC 2007, Digest of Technical Papers, IEEE International, pp. 314-316, 2007.

A. Pinto, et al., "A Study on the Offset Voltage of Dynamic Comparators", Design of Circuits and Integrated Systems, 2013.

* cited by examiner

COMPARATOR CIRCUIT WITH LOW POWER CONSUMPTION AND LOW KICKBACK NOISE

This application claims priority for Taiwan patent application no. 108144553 filed on Dec. 5, 2019, the content of which is incorporated by reference in its entirely.

BACKGROUND OF THE INVENTION

1. Field of the Invention

The present invention is related to a comparator circuit, and more particularly to a comparator circuit with low power consumption and low kickback noise.

2. Description of the Related Art

Comparators are common electronic components, and in some circuit designs, the comparator plays an important role, for example, in an analog to digital converter (ADC), performance of the comparator affects accuracy, speed and power consumption of the ADC.

Common types of comparators include static comparator and dynamic comparator. Since the static comparator has static power consumption and dynamic comparator does not, dynamic comparators are more commonly used in various applications. The dynamic comparator uses a positive feedback scheme to obtain a gain $G=\exp(\Delta t/\tau m)$, that is, the gain increases exponentially over time, so the dynamic comparator can easily have a high value of gain, wherein $\tau m = C/gm$ is a regeneration time constant, C is a load, and gm is transconductance. Because of not having static power consumption, the dynamic comparator has low power consumption and higher gain compared to the static comparator. However, the dynamic comparator has a problem of kickback noise coupled to an input terminal of the dynamic comparator, and it possibly causes the dynamic comparator to output incorrect signal.

A method of reducing kickback noise is disclosed in "Kickback noise reduction techniques for CMOS latched comparators," IEEE Transactions on Circuits and Systems II: Express Briefs, Vol. 53, No. 7, pp. 541-545, 2006. However, this method needs to increase an isolation transistor, which will cause additional offset voltage. Besides, the method also needs to precharge a drain voltage Vd of a differential input pair to VDD/2 to achieve the effect of reducing kickback noise, wherein VDD is a supply voltage of the dynamic comparator. However, except for DRAM, the dynamic comparators in other existing circuits cannot precharge the drain voltages Vd to VDD/2, so it is hard to apply the above-mentioned method of reducing kickback noise to dynamic comparators of circuits other than DRAM.

In addition, the comparator generates an offset voltage due to process variations, and the offset voltage also causes the comparator to generate incorrect comparison results. The aforementioned process variations include variation in amount of dope, interface state density, and the like.

In order to reduce the offset voltage, a conventional method is to add a pre-amplifier before the comparator. For example, U.S. Pat. No. 8,188,768 uses a static comparator as a pre-amplifier. In order to reduce the offset voltage and amplify a small input voltage to a full logic voltage, the pre-amplifier is required to have a high gain; however, when a size of the transistor is decreased, resistance Rds between drain and source of a MOSFET also decreases, and it causes limitation in the gain of the static comparator. Furthermore, because the static comparator has a fixed static power consumption, the pre-amplifier consumes more power.

"A 70.7-dB SNDR 100-kS/s 14-b SAR ADC with attenuation capacitance calibration in 0.35-μm CMOS," Analog Integrated Circuits and Signal Processing, Vol. 89, pp. 357-371, 2016, disclosed a pre-amplifier which includes two static comparators connected in series. Although the static comparator of each stage of the pre-amplifier has a gain less than 10, the combination of the two static comparators can generate a high gain, for example, when the gain of the static comparator of each stage is 6, the combination of the two static comparators can generate a gain of 36=6×6. In order to reduce static power consumption, in the conventional method, the power supply is turned on only when detection is performed, but operating points of the static comparators must be reestablished after the power supply is turned on, and it makes the response speed of the static comparator slower and also causes kickback noise.

The conventional two-stage comparator circuit including the pre-amplifier and the comparator fails to achieve performance with low power consumption and low kickback noise. Therefore, what is needed is to develop a comparator circuit with low power consumption and low kickback noise, to solve above-mentioned problems.

SUMMARY OF THE INVENTION

An objective of the present invention is to provide a comparator circuit with low power consumption and low kickback noise.

An objective of the present invention is to provide a comparator circuit which uses a sensing slew rate control to reduce kickback noise.

According to the present invention, a comparator circuit with low power consumption and low kickback noise comprises a first dynamic comparator, a second dynamic comparator, a first enable switch, a second enable switch and a resistance device. The first dynamic comparator compares a first input signal and a second input signal to generate a first output signal and a second output signal. The second dynamic comparator compares the first output signal and the second output signal to generate a first comparison signal and a second comparison signal, and the second comparison is complementary to the first comparison signal. The first and second enable switches are configured to activate or deactivate the first and second dynamic comparators, respectively. The resistance device is connected to a control terminal of the first enable switch, so that the resistance device and a parasitic capacitance of first enable switch can form an RC delay circuit to reduce kickback noise of the comparator circuit. Since the comparator circuit is formed by dynamic comparators, the comparator circuit has zero static power consumption.

According to the present invention, the comparator circuit further comprises a control circuit configured to activate the second dynamic comparator after the first dynamic comparator is activated for a preset time, so as to reduce supply noise of the comparator circuit. The control circuit can activate the second dynamic comparator after a gain of the first dynamic comparator is equal to or higher than a preset value.

According to the present invention, a comparator circuit with low power consumption and low kickback noise includes a dynamic comparator, an enable switch and a resistance device. The dynamic comparator compares the first input signal and the second input signal to generate a first comparison signal and a second comparison signal, and the second comparison signal is complementary to the first comparison signal. The enable switch can activate or deactivate the dynamic comparator. The resistance device is connected to a control terminal of the enable switch, so that the resistance device and a parasitic capacitance of the enable switch can form an RC delay circuit to reduce kickback noise of the comparator circuit. Since the comparator circuit is formed by a dynamic comparator, the comparator circuit has zero static power consumption.

BRIEF DESCRIPTION OF THE DRAWINGS

The structure, operating principle and effects of the present invention will be described in detail by way of various embodiments which are illustrated in the accompanying drawings.

DETAILED DESCRIPTION OF THE PREFERRED EMBODIMENTS

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be acknowledged that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the word "comprise", "include" and "have", and variations such as "comprises", "comprising", "includes", "including", "has" and "having" will be acknowledged to imply the inclusion of stated elements but not the exclusion of any other elements.

Figure 1:
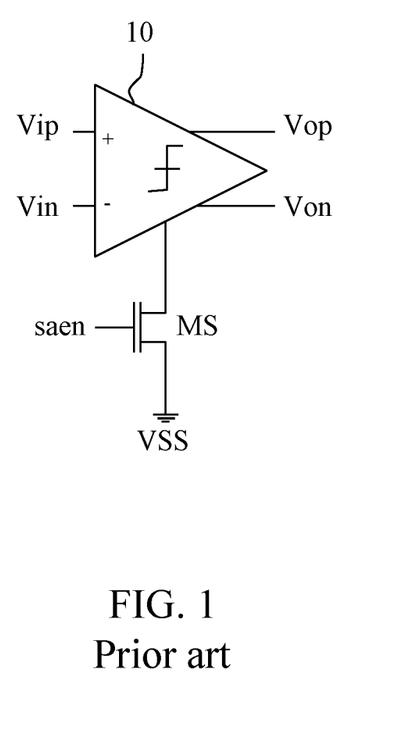
FIG. 1 shows a conventional dynamic comparator.
Figure 2:
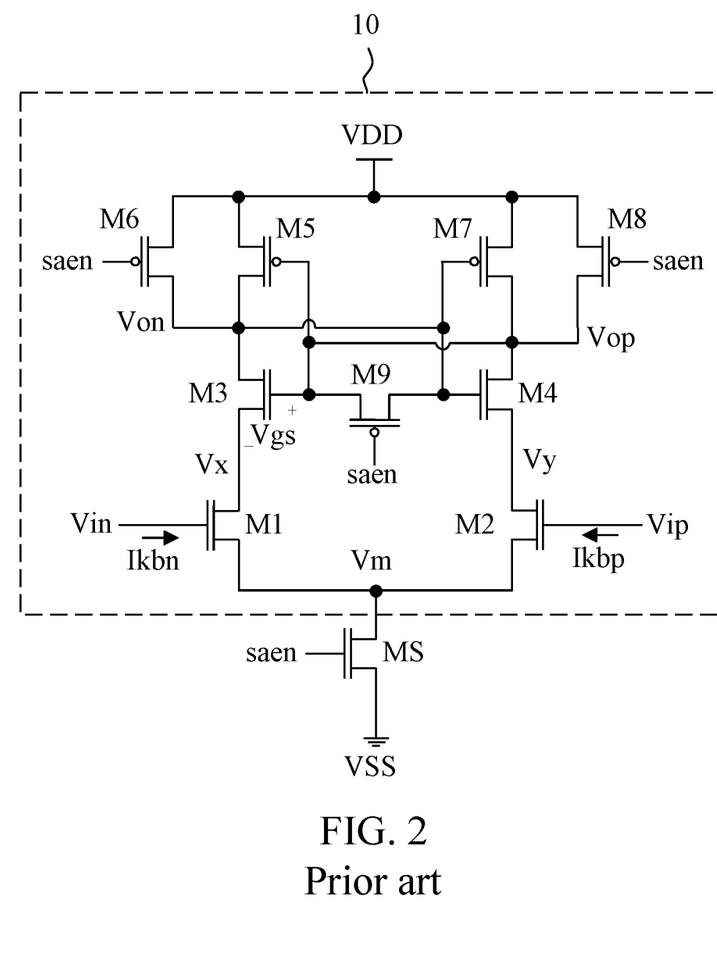
FIG. 2 shows an architecture of the conventional dynamic comparator of FIG. 1.

FIG. 1 shows a conventional dynamic comparator 10. The conventional dynamic comparator 10 compares input signals Vip and Vin to generate comparison signals Vop and Von, which are complementary to each other, that is, when the comparison signal Vop is "1", the comparison signal Von is "0"; in contrast, when the comparison signal Vop is "0", the comparison signal Von is "1". The enable switch MS is connected to the dynamic comparator 10, and configured to activate or deactivate the dynamic comparator 10. FIG. 2 shows an embodiment of the dynamic comparator 10 of FIG. 1. When the enable signal saen is "0", the dynamic comparator 10 is in a reset state, and at this time, the comparison signals Vop and Von are pre-charged to a level of voltage VDD regardless of values of the input signals Vip and Vin. The voltage VDD is a supply voltage of the dynamic comparator. When the enable signal saen is "1", the enable switch MS is turned on to make Vm=VSS, wherein the voltage VSS is a ground voltage of the dynamic comparator; at this time, the differential input pair, which includes transistors M1 and M2, can determine to turn on the transistor M1 or M2 based on values of the input signals Vip and Vin. When Vin>Vip, the transistor M1 is turned on to make a drain voltage Vx of the transistor M1 drop, and after a gate-source voltage Vgs1 of the transistor M3 becomes higher than the threshold voltage Vth1 of the transistor M3 because of drop of the drain voltage Vx, the transistor M3 is turned on to make the comparison signal Von drop, and eventually the comparison signal Von is equal to VSS (that is, Von=VSS) and the comparison signal Vop is equal to VDD (that is, Vop=VDD). In the other hand, when the enable signal saen is "1" and Vin<Vip, the comparison signal Von is equal to VDD (that is, Von=VDD) and the comparison signal Vop is equal to VSS (that is, Vop=VSS). The circuit and operation of the dynamic comparator 10 of FIG. 2 are well known in the art, so detailed descriptions are not repeated herein.

Figure 3:
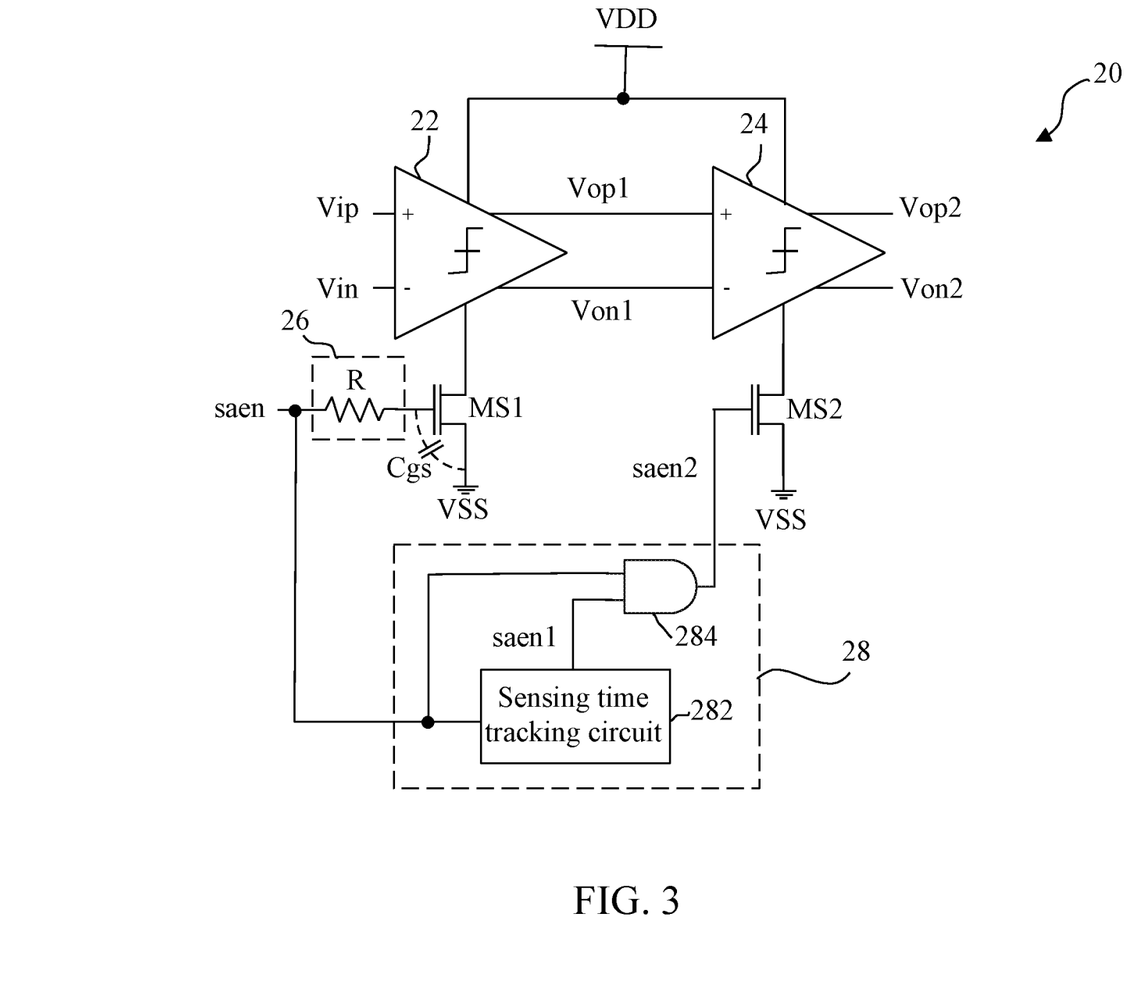
FIG. 3 shows a two-stage pipelined comparator circuit of the present invention.

FIG. 3 shows a two-stage pipelined comparator circuit 20 of the present invention. The two-stage pipelined comparator circuit 20 comprises dynamic comparators 22 and 24, enable switches MS1 and MS2, a resistance device 26 and a control circuit 28. The dynamic comparator 22 compares the input signals Vip and Vin to generate output signals Vop1 and Von1, the dynamic comparator 24 compares the output signals Vop1 and Von1 to generate comparison signals Vop2 and Von2. The dynamic comparator 22 is used as a preamplifier, and detailed circuits of the dynamic comparators 22 and 24 can refer to that of the dynamic comparator 10 of FIG. 2. According to the present invention, the comparator circuit 20 has zero static power consumption because of using the dynamic comparators 22 and 24, and the comparator circuit 20 of the present invention has lower power consumption compared with the conventional technology using static comparators. The enable switches MS1 and MS2 are connected to the dynamic comparators 22 and 24 and configured to activate or deactivate the dynamic comparators 22 and 24, respectively. In an embodiment, each of the enable switches MS1 and MS2 can be, but not limited to, a MOSFET. The resistance device 26 is connected to a control terminal (gate) of the enable switch MS1 and has a resistance value R, and the resistance device 26 and a parasitic capacitance Cgs between gate and source of the enable switch MS1 can form an RC delay circuit. The resistance device 26 can be, but not limited to, a resistor or a passgate.

Figure 4:
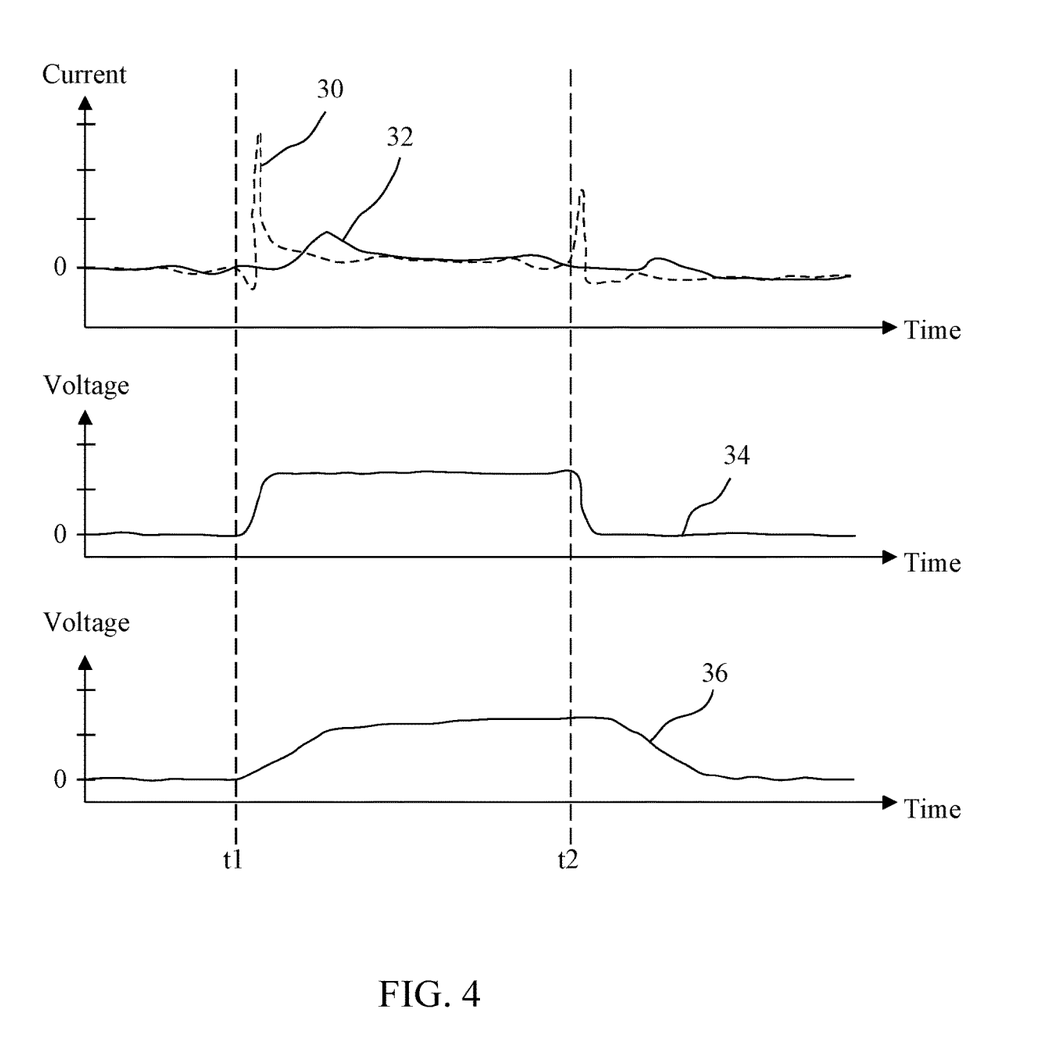
FIG. 4 shows kickback noises of the conventional dynamic comparator and the dynamic comparator of the present invention.

The delay circuit formed by the resistance device 26 and the parasitic capacitance Cgs can determine a sensing slew rate of the dynamic comparator 22, to control kickback noise of the dynamic comparator 22. FIG. 4 shows kickback noises of the conventional dynamic comparator 10 and the dynamic comparator 22 of the present invention. As shown in FIG. 4, a waveform 30 shows kickback noise Ikbp or Ikbn on the input terminal of the conventional dynamic comparator 10, a waveform 32 shows kickback noise on the input terminal of the dynamic comparator 22 of the present invention, a waveform 34 shows a voltage on the control terminal of the conventional enable switch MS, and a waveform 36 shows a voltage on the control terminal of the enable switch MS1 of the present invention. Please refer to waveforms 30 and 34 shown in FIGS. 2 and 4. When the control terminal of the enable switch MS is not connected to the resistance device 26, the enable switch MS is fully turned on and off rapidly at a rising edge and a falling edge of the enable signal saen, respectively, as shown in parts of the waveform 34 at time point t1 and t2. When the enable switch MS is switched too rapidly, the signals Vop and Von on the output terminal of the dynamic comparator 10 are transiently changed dramatically, and it causes higher kickback noise which is coupled to the input terminal of the dynamic comparator 10, as shown in parts of the waveform 30 at time points t1 and t2. Please refer to the waveforms 32 and 36 shown in FIGS. 3 and 4. According to the present invention, the resistance device 26 is connected to the control terminal of the enable switch MS1, to form an RC delay circuit, so that the voltage on the control terminal of the enable switch MS1 can be increased or decreased slowly at the rising edge and the falling edge of the enable signal saen, respectively, as shown in parts of the waveform 36 at the time points t1 and t2; as a result, current flowing through the enable switch MS1 can be increased or decreased slowly, so as to prevent the signals Vop1 and Von1 on the output terminal of the dynamic comparator from being dramatically changed because of high transient current, thereby reducing kickback noise coupled to the input terminal, as shown in parts of the waveform 32 at the time points t1 and t2. Therefore, kickback noise of the dynamic comparator 22 of the present invention can be about 5.5%~25% of that of the conventional dynamic comparator 10.

The sensing slew rate of the dynamic comparator 22 can be determined by the resistance value R of the resistance device 26 and the parasitic capacitance Cgs of the enable switch MS1, so the resistance device with different resistance and the enable switch with the different size can be selected to control the sensing slew rate, so as to control the increasing speed or decreasing speed of the voltage on the control terminal of the enable switch MS1, thereby controlling level of kickback noise.

The two-stage pipelined comparator circuit of FIG. 3 is taken as an example for illustration, but the method of reducing kickback noise according to the present invention can be applied to a single-stage comparator circuit; for example, the dynamic comparator 24, the enable switch MS2 and the control circuit 28 of FIG. 3 can be omitted, and in this case, the dynamic comparator 22 compares the input signals Vip and Vin to generate the comparison signals Vop2 and Von2, and the resistance device 26 and the enable switch MS1 can form an RC delay circuit to reduce kickback noise of the comparator circuit.

Figure 5:
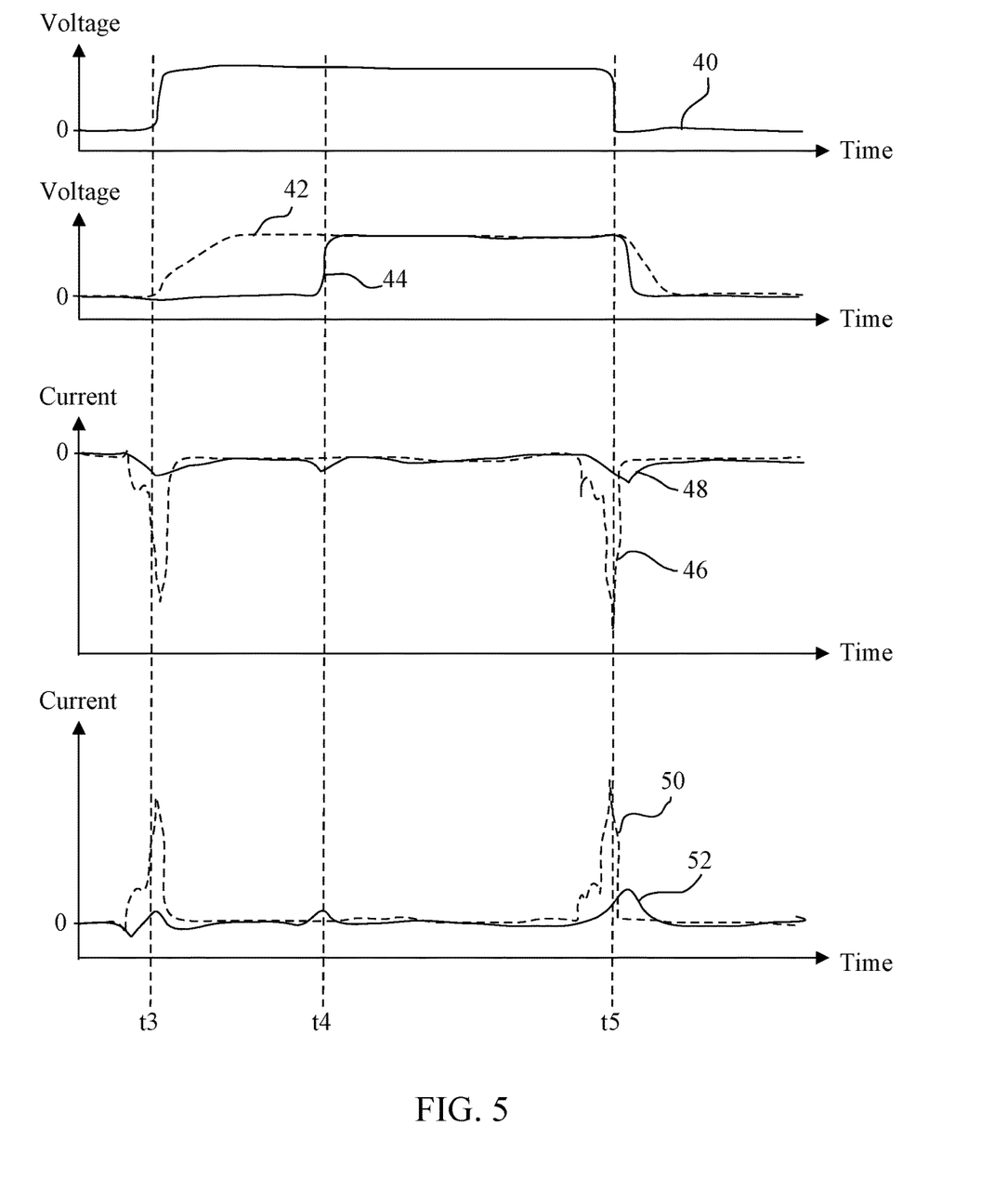
FIG. 5 illustrates a method for reducing supply noise, according to the present invention.

FIG. 5 illustrates a method for reducing supply noise, according to the present invention. As shown in FIG. 5, a waveform 40 is the enable signal saen, a waveform 42 shows a voltage on the control terminal of the enable switch MS1, a waveform 44 is an enable signal saen2, and waveforms 46 to 52 show supply noises. As shown in FIG. 3, since the dynamic comparators 22 and 24 are connected to the same power terminal (VDD) and the same ground terminal (VSS), when the dynamic comparators 22 and 24 are activated or deactivated at the same time, high transient current occurs on the power terminal, and it causes higher supply noise on the power terminal, as shown in parts of the waveform 46 at time points t3 and t5; similarly, high transient current flowing to ground terminal also occurs, and it causes higher supply noise on the ground terminal, as shown in parts of the waveform 50 at time points t3 and t5. The supply noise can be coupled to the input terminals of the dynamic comparators 22 and 24, to cause the dynamic comparator to make wrong determination. The comparator circuit 20 of the present invention can use the control circuit 28 to activate the dynamic comparator 24 after the dynamic comparator 22 is activated for a preset time, as shown in a part of the waveform 42 at time point t3 and a part of the waveform 44 at time point t4; furthermore, the dynamic comparators 22 and 24 are not activated at the same time, so that supply noise can be reduced, as shown in parts of the waveforms 48 and 52 at time points t3 and t4. Compared with the condition that the dynamic comparators 22 and 24 are activated at the same time, the method of separately activating the dynamic comparators 22 and 24 according to the present invention can reduce 85% of supply noise. Similarly, when the enable signal saen is changed to low level, as shown in part of waveform 40 at time point t5, the dynamic comparator 24 is deactivated first, and the dynamic comparator 22 is deactivated after a RC delay time after the dynamic comparator 24 is deactivated, so that supply noise can be reduced, as shown in parts of waveforms 42, 44, 48 and 52 at the time point t5. In an embodiment, compared with the condition that the dynamic comparators 22 and 24 are deactivated at the same time, the method of deactivating the dynamic comparators 22 and 24 at different times according to the present invention can reducing 75% of supply noise.

Figure 6:
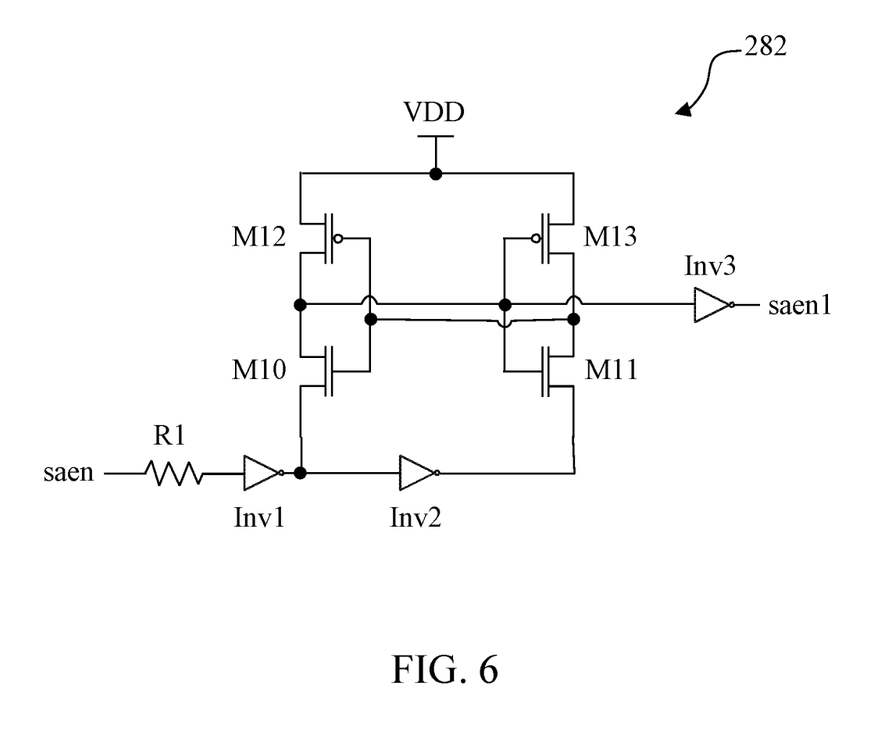
FIG. 6 shows an embodiment of a sensing time tracking circuit.

The control circuit 28 of FIG. 3 comprises a sensing time tracking circuit 282 and an AND gate 284. The sensing time tracking circuit 282 can receive and delay the enable signal saen to generate the enable signal saen1, and the AND gate 284 has two input terminals for receiving the enable signals saen and saen1, and can generate the enable signal saen2 to turn on or off the enable switch MS2 based on the enable signals saen and saen1. FIG. 6 shows an embodiment of the sensing time tracking circuit 282. As shown in FIG. 6, an inverter Inv1 can receive the enable signal saen, an input terminal of an inverter Inv2 is connected to an output terminal of the inverter Inv1, and control terminals of the transistors M10 and M12 are connected to each other, two terminals of the transistor M10 are respectively connected to an output terminal of the inverter Inv1 and a terminal of the transistor M12, the other terminal of the transistor M12 receives the supply voltage VDD, control terminals of the transistors M11 and M13 are connected to each other and also connected to the terminal of the transistor M12, two terminals of the transistor M11 are respectively connected to the output terminal of the inverter Inv2 and a terminal of the transistor M13, and the other terminal of the transistor M13 receives the supply voltage VDD. The inverter Inv3 has an input terminal connected to the terminal of the transistor M12, and an output terminal for providing the enable signal saen1.

Figure 7:
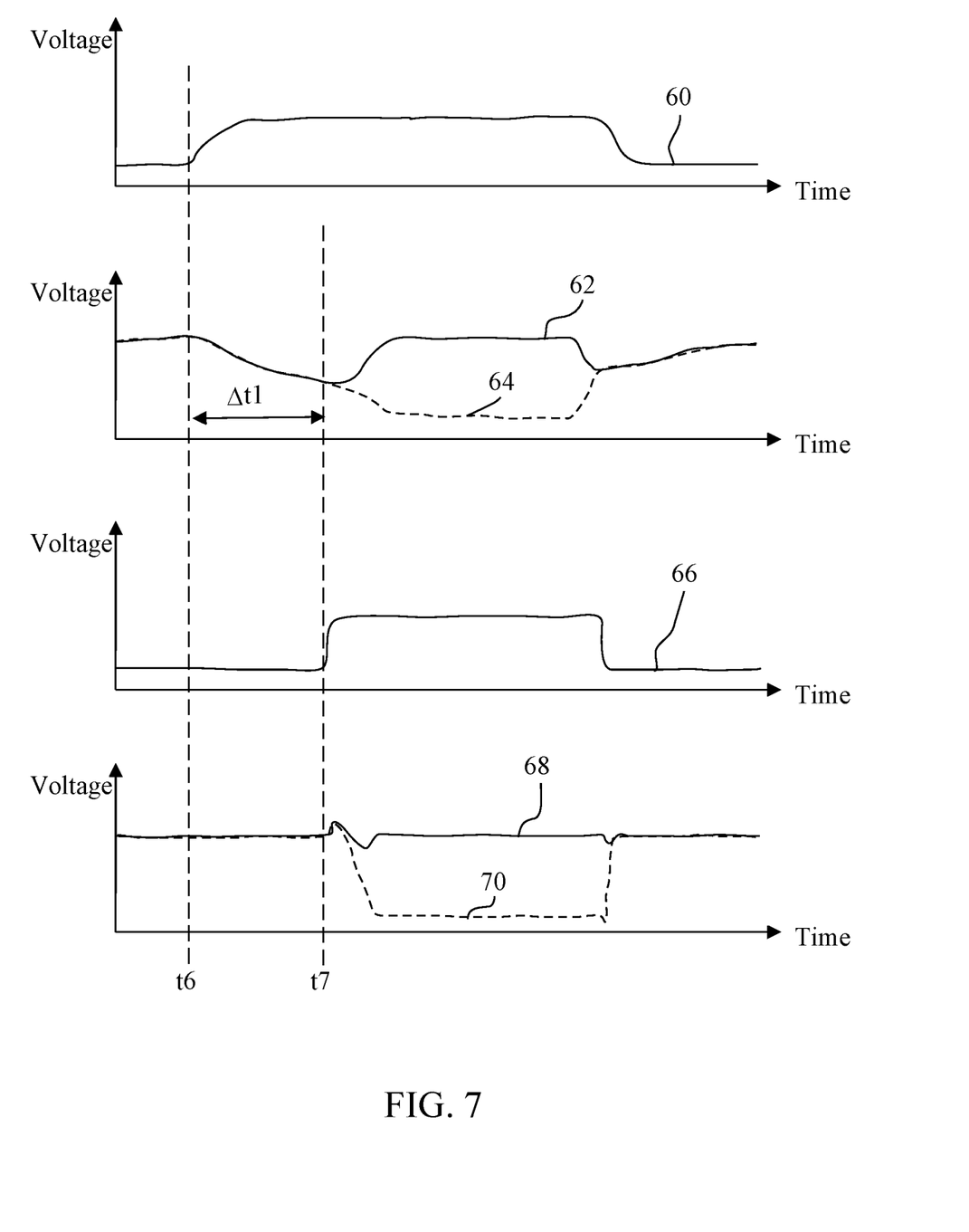
FIG. 7 shows output waveforms of two dynamic comparators of FIG. 3.

Furthermore, the gain G=exp(Δt/τm) of the dynamic comparator is increased over time, so when the dynamic comparator 24 is activated after a preset time after the dynamic comparator 22 is activated, the dynamic comparator 24 can be prevented from being activated under a condition that the gain of the dynamic comparator 22 is insufficient, so as to prevent wrong determination of the dynamic comparator 24. FIG. 7 shows outputs of the two dynamic comparators of FIG. 3. As shown in FIG. 7, a waveform 60 is a voltage on the control terminal of the enable switch MS1, a waveform 62 is the output signal Vop1 of the dynamic comparator 22, a waveform 64 is the output signal Von1 of the dynamic comparator 22, a waveform 66 is the enable signal saen2, a waveform 68 is the comparison signal Vop2 of the dynamic comparator 24, and a waveform 70 is the output signal Von2 of the dynamic comparator 24. The gain G1=exp(Δt1/τm1) of the first stage (the dynamic comparator 22) can be determined based on the preset time Δt1. At the time point t6, the dynamic comparator 22 is activated, the inputted small signals Vip and Vin are amplified by the dynamic comparator 22, and after the sensing time tracking circuit 282 tracks for the preset time Δt1, the dynamic comparator 24 is activated at the time point t7, as shown in the waveforms 66, 68 and 70. According to the present invention, the dynamic comparator 24 is not activated until the gain G1 of the dynamic comparator 22 is equal to or higher than a preset value, so as to prevent wrong determination. Since the dynamic comparator 24 has a higher regeneration time constant τm2, the gain G2 of the dynamic comparator 24 can quickly reach a preset value after the dynamic comparator 24 is activated, and the comparison signals Vop2 and Von2 can quickly reach a high level state or a low level state.

The regeneration time constant τm1 of the dynamic comparator 22 can be preset as a fixed value, so that the control circuit 28 can be used to adjust the time Δt1 to control the gain G1 while the dynamic comparator 24 is activated. Furthermore, the sensing time tracking circuit 282 can have transistors with sizes respectively the same as that of the transistors of the dynamic comparator 22, or have a regeneration time constant the same as the regeneration time constant τm1 of the dynamic comparator 22, so that the sensing time tracking circuit 282 can activate the dynamic comparator 24 only after the gain G1 of the dynamic comparator 22 reaches the preset value in different process corner; for example, in typical-typical corner, the sensing time tracking circuit 282 activates the dynamic comparator 24 when the gain G1 reaches 105, and in slow-slow corner, the sensing time tracking circuit 282 activates the dynamic comparator 24 when the gain G1 reaches 75.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A comparator circuit with low power consumption and low kickback noise configured to compare a first input signal and a second input signal to generate a first comparison signal and a second comparison signal which is complementary to the first comparison signal, and the comparator circuit comprising:
   a first dynamic comparator configured to compare the first input signal and the second input signal to generate a first output signal and a second output signal;
   a second dynamic comparator connected the first dynamic comparator and configured to generate the first comparison signal and the second comparison signal based on the first output signal and the second output signal;
   a first enable switch connected to the first dynamic comparator, having a parasitic capacitance, and configured to activate or deactivate the first dynamic comparator;
   a second enable switch connected to the second dynamic comparator, and configured to activate or deactivate the second dynamic comparator; and
   a resistance device connected to a control terminal of the first enable switch, wherein the resistance device and the parasitic capacitance form an RC delay circuit to reduce kickback noise of the comparator circuit.

2. The comparator circuit according to claim 1, wherein the first enable switch is a MOSFET.

3. The comparator circuit according to claim 1, wherein the resistance device is a resistor.

4. The comparator circuit according to claim 1, wherein the resistance device is a pass gate.

5. The comparator circuit according to claim 1, further comprising a control circuit connected to a control terminal of the second enable switch and configured to activate the second dynamic comparator after the first dynamic comparator is activated for a preset time.

6. The comparator circuit according to claim 5, wherein after the first dynamic comparator is activated for the preset time, a gain of the first dynamic comparator is equal to or higher than a preset value.

7. The comparator circuit according to claim 5, wherein the control circuit comprises:
   a sensing time tracking circuit configured to delay a first enable signal to generate a second enable signal, wherein the first enable signal is used to turn on or off the first enable switch; and
   an AND gate connected to the sensing time tracking circuit and the second enable switch, and having two input terminals configured to respectively receive the first enable signal and the second enable signal, and an output terminal configured to provide a third enable signal to turn on or off the second enable switch.

8. The comparator circuit according to claim 7, wherein sizes of transistors of the sensing time tracking circuit are the same as that of the transistors of the first dynamic comparator.

9. The comparator circuit according to claim 7, wherein the sensing time tracking circuit has a first regeneration time constant equivalent to a second regeneration time constant of the first dynamic comparator.

10. The comparator circuit according to claim 7, wherein the sensing time tracking circuit comprises:
   a first inverter having a first input terminal and a first output terminal, wherein the first input terminal is configured to receive the first enable signal;
   a second inverter having a second input terminal and a second output terminal, wherein the second input terminal is connected to the first input terminal;
   a first transistor having a first terminal, a second terminal and a first control terminal, wherein the first terminal is configured to receive a supply voltage;
   a second transistor having a third terminal, a fourth terminal and a second control terminal, wherein the third terminal is connected to the second terminal, the fourth terminal is connected to the first output terminal, and the second control terminal is connected to the first control terminal;

a third transistor having a fifth terminal, a sixth terminal and a third control terminal, wherein the fifth terminal is configured to receive the supply voltage, the sixth terminal is connected to the first control terminal, and the third control terminal is connected to the second terminal;

a fourth transistor having a seventh terminal, an eighth terminal and a fourth control terminal, wherein the seventh terminal is connected to the sixth terminal, the eighth terminal is connected to the second output terminal, and the fourth control terminal is connected to the second terminal; and a third inverter having a third input terminal and a third output terminal, wherein the third input terminal is connected to the second terminal, the third output terminal is configured to provide the second enable signal.

11. A comparator circuit with low power consumption and low kickback noise, comprising:

a dynamic comparator configured to compare the first input signal and the second input signal to generate a first comparison signal and a second comparison signal, wherein the second comparison signal is complementary to the first comparison signal;

an enable switch connected to the first dynamic comparator and having parasitic capacitance, and configured to activate or deactivate the dynamic comparator; and a resistance device connected to a control terminal of the enable switch, wherein the resistance device and the parasitic capacitance form an RC delay circuit to reduce kickback noise of the comparator circuit.

12. The comparator circuit according to claim 11, wherein the enable switch is a MOSFET.

13. The comparator circuit according to claim 11, wherein the resistance device is a resistor.

14. The comparator circuit according to claim 11, wherein the resistance device is a pass gate.

* * * * *